(12) United States Patent
Lung

(10) Patent No.: US 6,914,282 B2
(45) Date of Patent: Jul. 5, 2005

(54) FERROELECTRIC DEVICE AND METHOD FOR MAKING

(75) Inventor: Hsiang-Lan Lung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 118 days.

(21) Appl. No.: 10/271,241

(22) Filed: Oct. 15, 2002

(65) Prior Publication Data

US 2004/0070015 A1 Apr. 15, 2004

(51) Int. Cl.⁷ ............................................. H01L 29/94
(52) U.S. Cl. ..................... 257/295; 257/306; 257/310; 361/303; 361/306.3
(58) Field of Search ............................... 257/295, 306, 257/310; 361/303, 306.3; 428/697, 699; 438/2, 104

(56) References Cited

U.S. PATENT DOCUMENTS

| | | | |
|---|---|---|---|
| 5,046,043 A | 9/1991 | Miller et al. | |
| 5,119,154 A | 6/1992 | Gnadinger | |
| 5,273,927 A | * 12/1993 | Gnadinger | ...................... 438/3 |
| 5,589,284 A | * 12/1996 | Summerfelt et al. | ........ 428/697 |
| 5,739,563 A | * 4/1998 | Kawakubo et al. | .......... 257/295 |
| 5,817,170 A | 10/1998 | Desu et al. | |
| 5,854,104 A | 12/1998 | Onishi et al. | |
| 5,963,466 A | 10/1999 | Evans, Jr. | |
| 5,998,236 A | * 12/1999 | Roeder et al. | ............... 438/104 |
| 6,075,264 A | 6/2000 | Koo | |
| 6,485,988 B2 | 11/2002 | Ma et al. | |
| 6,627,931 B1 | 9/2003 | Casagrande et al. | |
| 6,728,093 B2 | * 4/2004 | Fox | ............................. 361/303 |
| 2002/0033494 A1 | 3/2002 | Ozaki et al. | |
| 2002/0045311 A1 | 4/2002 | Mikawa | |
| 2002/0196653 A1 | 12/2002 | Kim et al. | |

OTHER PUBLICATIONS

S.L. Lung et al, Low Temperature Epitaxial Growth of PZT on Conductive Perovskite LaNiO, Electrode for Embedded Capacitor–Over–Interconnect (COI) FeRAM Application, Abstract, IEDM Conference, Dec., 2001.

* cited by examiner

Primary Examiner—David Nelms
Assistant Examiner—Dao H. Nguyen
(74) Attorney, Agent, or Firm—Haynes Beffel & Wolfeld LLP

(57) ABSTRACT

A ferroelectric subassembly for an integrated circuit includes a second layer lying between and in contact with first and third layers. The second layer comprises a ferroelectric material while the first and third layers comprise capacitor electrodes in contact with the second layer. At least a portion of the first layer contacting the second layer has the same crystal structure as the second layer. The first layer acts as both a seed layer for the ferroelectric material and as a capacitor electrode. One or both of the first and third layers may comprise $LaNiO_3$ (LNO). The second layer may, for example, comprise lead zirconate titanate (PZT), lead lanthanum zirconate titanate (PLZT) or $SrBi_2TaO_9$ (SBT) or an appropriate combination thereof. Any lattice mismatch between the first and second layers and/or between the second and third layers may be less than about 5 percent.

20 Claims, 9 Drawing Sheets

"FERROELECTRIC DEVICE AND METHOD FOR MAKING"

CROSS-REFERENCE TO RELATED APPLICATION

This application is related to a copending patent application Ser. No. 10/270,997, filed on the same day as this application and having the same assignee, entitled "Ferroelectric Capacitor Memory Device Fabrication Method".

BACKGROUND OF THE INVENTION

Computer memories may be classified as either volatile, that is memories that lose their stored information when power is removed, or non-volatile, that is memories that retain their stored information when power is removed. One type of nonvolatile memory uses a ferroelectric dielectric layer within the device. The direction of polarization of these ferroelectric capacitor memory devices, commonly called FeRAM, is used to determine its binary storage state.

FeRAM is considered an ideal memory because of its low power consumption, low operation voltage, high writing speed and high endurance. Traditionally, the ferroelectric capacitor is fabricated before the CMOS interconnect process because ferroelectric materials, such as lead zirconate titanate (PZT) and $SrBi_2TaO_9$ (SBT), require high temperature treatment (>600° C.) to crystallize into ferroelectric phases. However, the plasma and hydrogen-containing atmospheres used in CMOS interconnect processes damage the ferroelectric capacitor and decrease the reliability of FeRAM (Takashi Hase, Takehiro Noguchi and Yoichi Miyasaka, "Analysis of The Degradation of PZT and $SrBi_2TaO_9$ Thin Films with A Reductive Process," Integrated Ferroelectric, 16, pp. 29–40, 1997). The COI (Capacitor Over Interconnect) process is attractive because it eliminates the backend process damage to the ferroelectric capacitor. However, since interconnect cannot withstand high temperature required for crystallizing PZT into the perovskite phase, COI can only be implemented if PZT can be crystallized at low temperature. Recently, lower temperature processes have been proposed, such as MOCVD-PZT (S. Kobayashi, K. Amanuma, H. Mori, N. Kasai, Y. Maejima, A. Seike, N. Tanabe, T. Tatsumi, J. Yamada, T. Miwa, H. Koike, H. Hada and Toyoshima, "64 Kbit CMVP FeRAM Macro with Reliable Retention/Imprint Characteristics," IEDM'00 Tech Digest, pp. 783–786, 2000), or $O_2$ free sputtering (Naoya Inoue, Takeshi Nakura and Yoshihiro Hayashi, "Low Thermal-budget Fabrication of Sputtered-PZT Capacitor on Multilevel Interconnects for Embedded FeRAM", IEDM'00 Tech Digest, pp. 797–800, 2000), but even these improvements still require processing temperature in the range of 430° C. to 475° C. which is still too high for CMOS interconnect, especially for advanced low k application.

See S. L. Lung, C. L. Liu, et al, "Low Temperature Epitaxial Growth of PZT on Conductive Perovskite $LaNiO_3$ Electrode for Embedded Capacitor-Over-Interconnect (COI) FeRAM Application", IEDM 01 Tech Digest, pp 275–278, 2001.

SUMMARY OF THE INVENTION

A first aspect of the invention is directed to a ferroelectric subassembly for an integrated circuit including first, second and third layers. The second layer lies between and is in contact with the first and third layers. The second layer comprises a ferroelectric material while the first and third layers comprise capacitor electrodes in contact with the second layer. At least a portion of the first layer contacting the second layer has the same crystal structure as the second layer. The first layer acts as both a seed layer for the ferroelectric material and as a capacitor electrode. One or both of the first and third layers may, for example, comprise $LaNiO_3$ (LNO) in contact with the second layer. The second layer may, for example, comprise lead zirconate titanate (PZT), lead lanthanum zirconate titanate (PLZT) or $SrBi_2TaO_9$ (SBT) or an appropriate combination thereof. Any lattice mismatch between the first and second layers and/or between the second and third layers may be less than about 5 percent.

A second aspect of the invention is directed to ferroelectric capacitor memory device comprising a ferroelectric subassembly and an integrated circuit (IC) layer, the IC layer comprising a pass transistor. The ferroelectric subassembly is formed on the IC layer and is operably coupled to the pass transistor. The ferroelectric subassembly includes first and second and third layers. The second layer lies between and is in contact with the first and third layers. The second layer comprises a ferroelectric material while the first and third layers comprise capacitor electrodes in contact with the second layer. At least a portion of the first layer contacting the second letter has the same crystal structure has the second layer. The first layer acts as both a seed layer for the ferroelectric material and as a capacitor electrode. Bit and word lines may be coupled to the pass transistor and connected to respective ones of the first and third layers. One or both of the first and third layers may, for example, comprise $LaNiO_3$ (LNO) in contact with the second layer. The IC layer on may, for example, be a complementary metal oxide semiconductor (CMOS) IC layer.

A third aspect of the invention is directed to a method for forming a ferroelectric capacitor on a substrate. A ferroelectric material and first and second capacitor electrode materials are selected, the first capacitor electrode material having the same crystal structure as the selected ferroelectric material. A first layer of the first capacitor electrode material is deposited on a substrate to form a first capacitor electrode. A layer of the selected ferroelectric material is deposited onto the first capacitor electrode. A layer of the second capacitor electrode material is deposited onto the layer of the ferroelectric material to form the second capacitor electrode. The second capacitor electrode material may be selected to have the same crystal structure as the selected ferroelectric material. One or both of the first and the second capacitor electrode material selecting steps may be carried out using, for example, $LaNiO_3$ (LNO) as a second capacitor electrode material. The first capacitor electrode depositing step may be preceded by depositing a protective metallic layer, such as at least one of platinum and TiAlN, on the substrate. The ferroelectric material selecting step may be carried out by selecting, for example, lead lanthanum zirconate titanate (PLZT), lead zirconate titanate (PZT) or $SrBi_2TaO_9$ (SBT), or an appropriate combination thereof, as the ferroelectric material. The ferroelectric material selecting step may be carried out so that any lattice mismatch between the ferroelectric material and the first capacitor electrode material is less than about 5 percent. The depositing step may be carried out at a temperature of below about 400° C., and typically between about 350° C. and 400° C.

The present invention may provide several advantages over conventional structures. By using a conductive perovskite $LaNiO_3$ (LNO) bottom electrode as a seed layer, the crystallization temperature of in-situ sputter deposited PZT has been greatly reduced from about 600° C. to about 350°

C. to 400° C. LNO has the same crystal structure as PZT with small (<5%) lattice mismatch. LNO's near-perfect lattice match with PZT allows PZT to growth epitaxially at low temperature. The 2Pr value of the low temperature grown PZT is about 20 C/cm$^2$, and this provides 130 mV–400 mV sense margin when bit line capacitance is 800 fF. When Pt is used as the top electrode, an amorphous layer, which degrades the electric fatigue performance, is found at the interface of Pt and PZT. When the top electrode is replaced by LNO, the thickness of the amorphous layer is decreased, and fatigue performance is improved. COI FeRAM structure can be easily achieved by this low temperature capacitor process, and is suitable for advanced Cu/low-K embedded logic applications. While LNO and PZT are presently generally preferred, other materials exhibiting similar properties of low crystallization temperature, same crystal structure and close lattice match may be used.

Other features and advantages will appear from the following description in which preferred embodiments and methods have been set forth in detail in conjunction with the accompanying drawings.

DETAILED DESCRIPTION OF THE INVENTION

Figure 1:
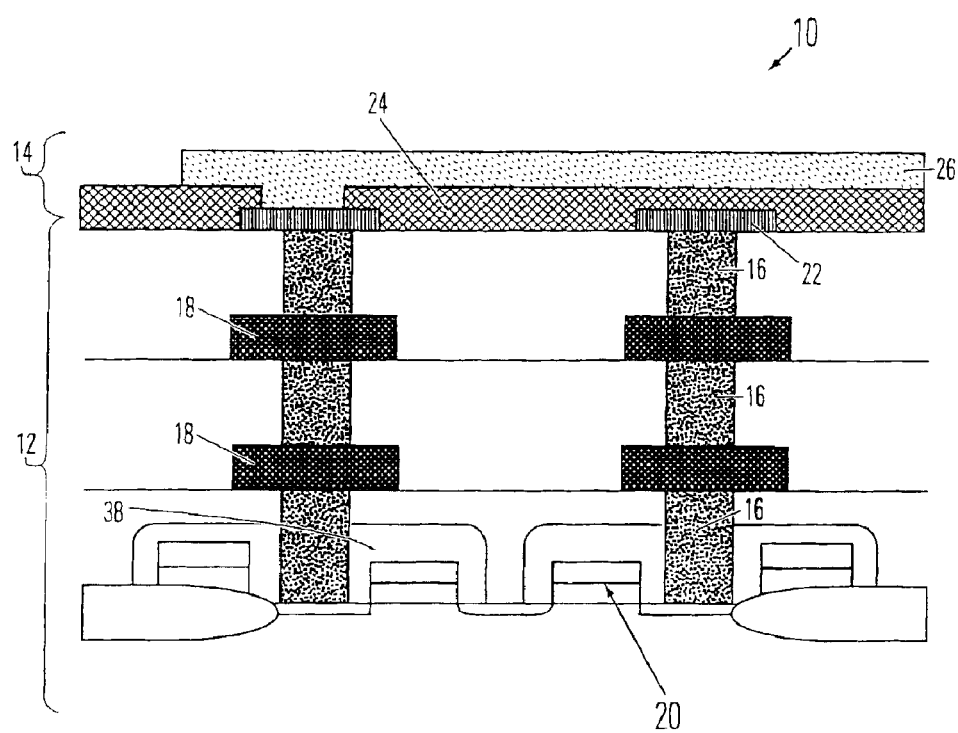
FIG. 1 is a simplified cross-sectional schematic view of a ferroelectric capacitor memory device made according to the invention.

FIG. 1 illustrates a ferroelectric capacitor memory device 10 to include an IC layer 12, typically a CMOS IC layer, and a ferroelectric subassembly 14. IC layer 12 comprises contact plugs 16, interconnect lines 18, and pass transistor 20 electrically coupled to ferroelectric subassembly 14 through contact plugs 16 and lines 18. The construction of IC layer 12 may be conventional.

Ferroelectric subassembly 14 includes first, second and third layers 22, 24 and 26 formed upon the IC layer 12. First and third layers 22, 26 comprise first and second capacitor electrodes while second layer 24 is made of a ferroelectric material. The deposition of first layer 22 also creates contact 23 and Dad 44 (shown in FIG. 3). First and second capacitor electrodes 22, 26 are preferably made of LaNiO3 (LNO). Second layer 24 may comprise lead zirconate titanate (PZT), or lead lanthanum zirconate titanate (PLZT), or SrBi2TaO9 (SBT), or an appropriate combination thereof. Other ferroelectric materials known now or discovered in the future may also be appropriate. At least the portion of first layer 22 contacting second layer 24 has the same crystal structure as the second layer so that first layer 22 acts as both a seed layer for the ferroelectric material of second layer 24 and as a capacitor electrode.

Any lattice mismatch between the first and second layers is preferably less than about 5 percent. This small lattice mismatch permits deposition at low temperatures, preferably less than about 400° C., such as about 350° C.–400° C. This low temperature permits formation of the ferroelectric capacitor on top of metal interconnects to create a construction termed capacitor over interconnect (COI). The low deposition temperature also reduces reactions between electrodes and the ferroelectric material and improves the reliability of ferroelectric capacitor memory device 10. Because ferroelectric subassembly 14 is formed after fabrication of interconnect layer 34 (discussed below with reference to FIG. 2), damage to the ferroelectric material during such fabrication steps is avoided.

Figure 2:
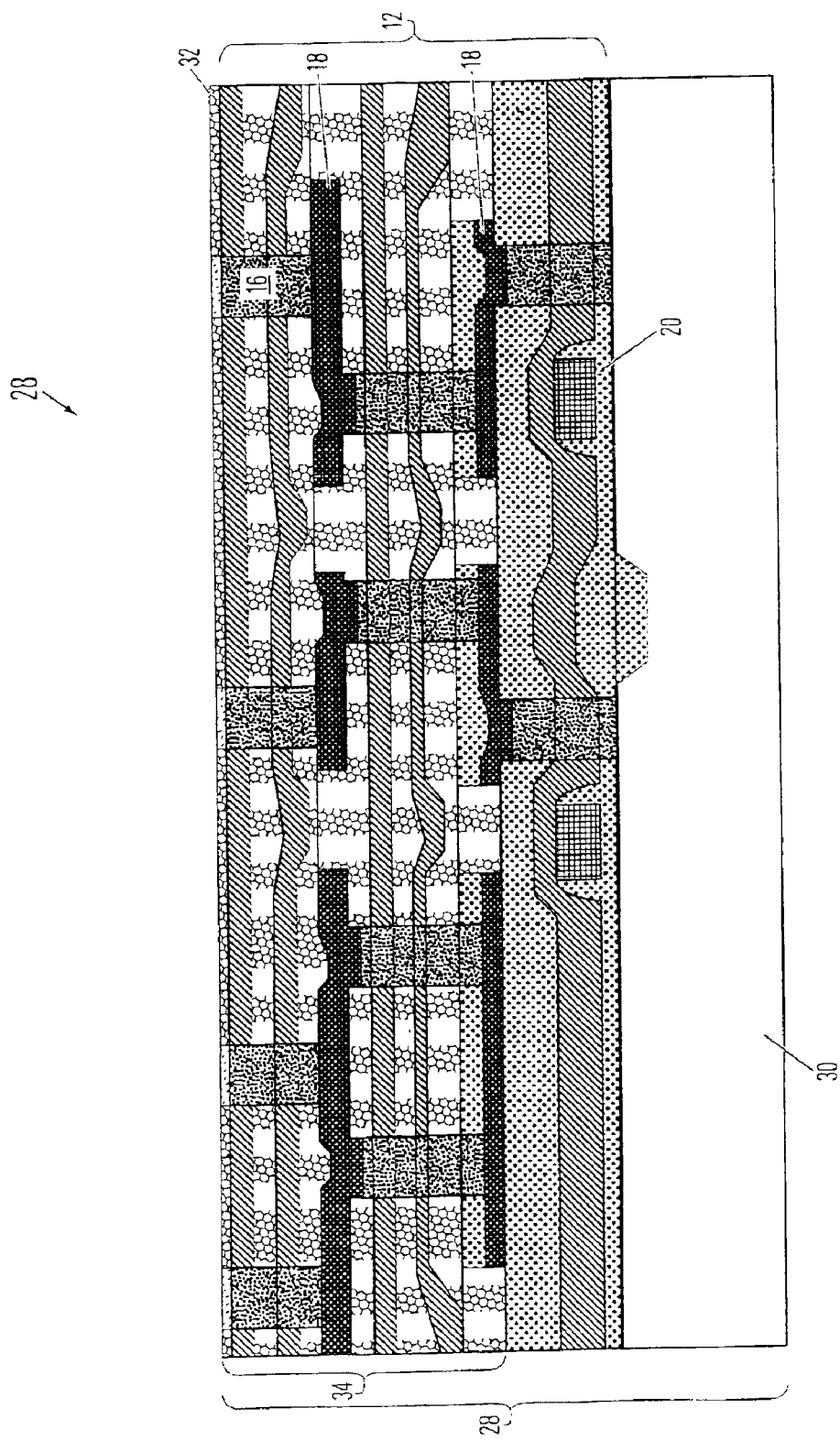
FIGS. 2–8 are cross-sectional views illustrating the steps involved in the fabrication of one example of a ferroelectric capacitor memory device made according to the invention, the device shown in its completed state in FIG. 8, FIG. 8 being taken along line 8—8 of FIG. 9.

FIG. 2 illustrates a substrate 28 with CMOS circuitry 30. The upper surface of substrate 28 comprises a barrier layer 32, typically made of, for example, platinum/titanium; other materials such as Ir/TiAlN or IrO$_2$/Ir/TiAlN, or a suitable combination thereof, may be used for barrier layer 32. Barrier layer 32 is used to prevent oxidation of contact plugs 16 and promote adhesion. Substrate 28 comprises an interconnect layer 34 as a part of IC layer 12. Within IC layer 12 are pass transistors 20 coupled to barrier layer 32 by contact plugs 16 and interconnect lines 18.

Figure 3:
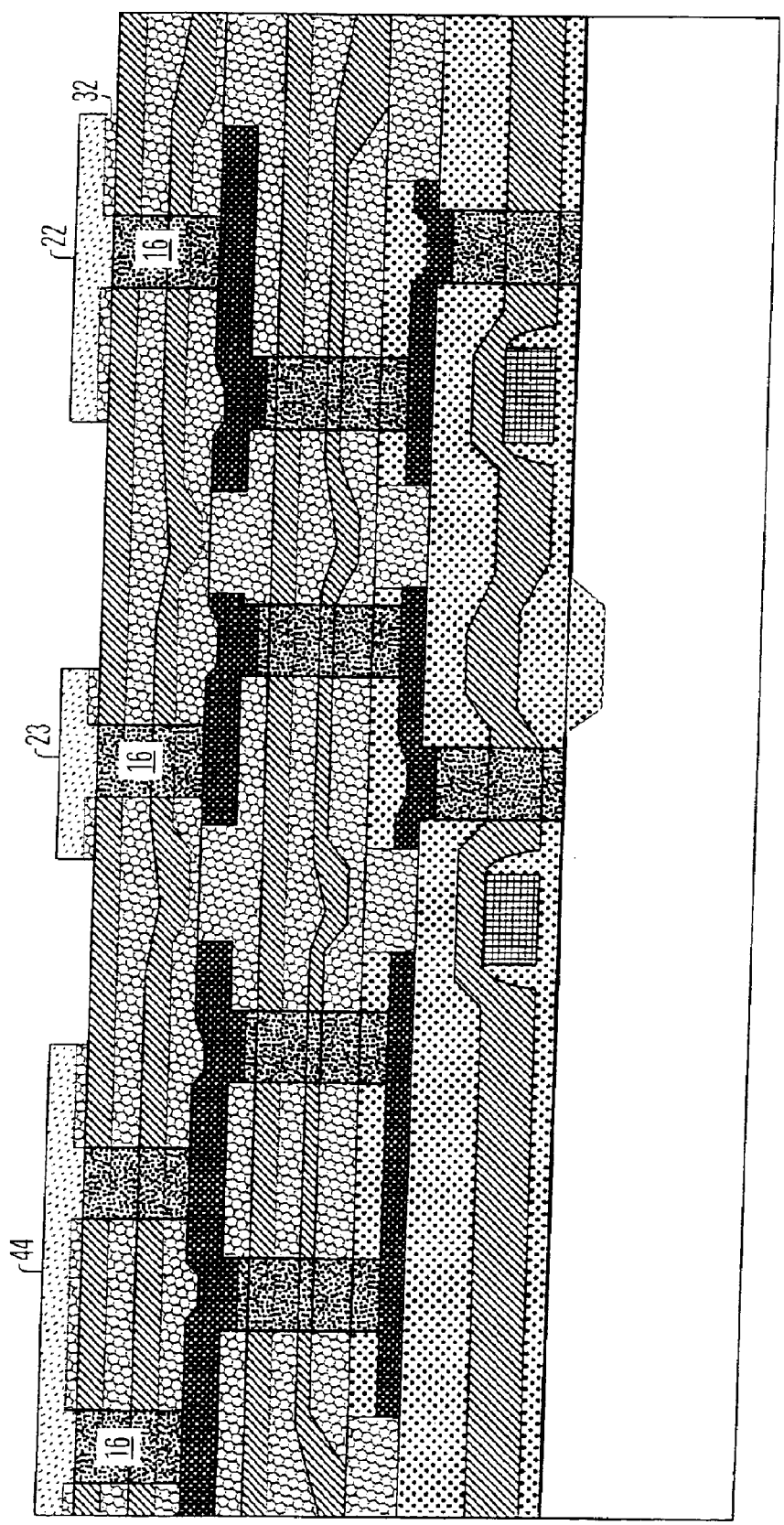

FIG. 3 illustrates the results of patterning and deposition of first capacitor electrodes 22, contacts 23 and pads 44 onto barrier layer 32 of IC layer 12 and in electrical contact with contact plugs 16. Barrier layer 32 has been removed in regions other than first capacitor electrodes 22 and pads 44 during the deposition of first capacitor electrodes 22 and pads 44. The first electrode 22, contact 23 and pad 44 are sputter deposited on barrier layer 32 at 350° C. in Ar/O2 gas using an LNO ceramic target made by sintering La2O3 and NiO powder at 1000° C. Based on XRD analysis, the 350° C. in-situ sputter deposited LNO is pure perovskite phase. With an electrical resistivity of about 300 $\mu$ohm-cm, LNO serves as a good electrode material. A ceramic PZT target, with 10% excess Pb and a Zr/Ti ratio equal to 53/47, is used to sputter the PZT constituting second layer 24 in this example. Pure argon is used because oxygen was found to suppress the formation of perovskite phase (Naoya Inoue, Takeshi Nakura and Yoshihiro Hayashi, "Low Thermal-budget Fabrication of Sputtered-PZT Capacitor on Multilevel Interconnects for Embedded FeRAM," IEDM'00 Tech Digest, pp. 797–800, 2000).

Figure 4:
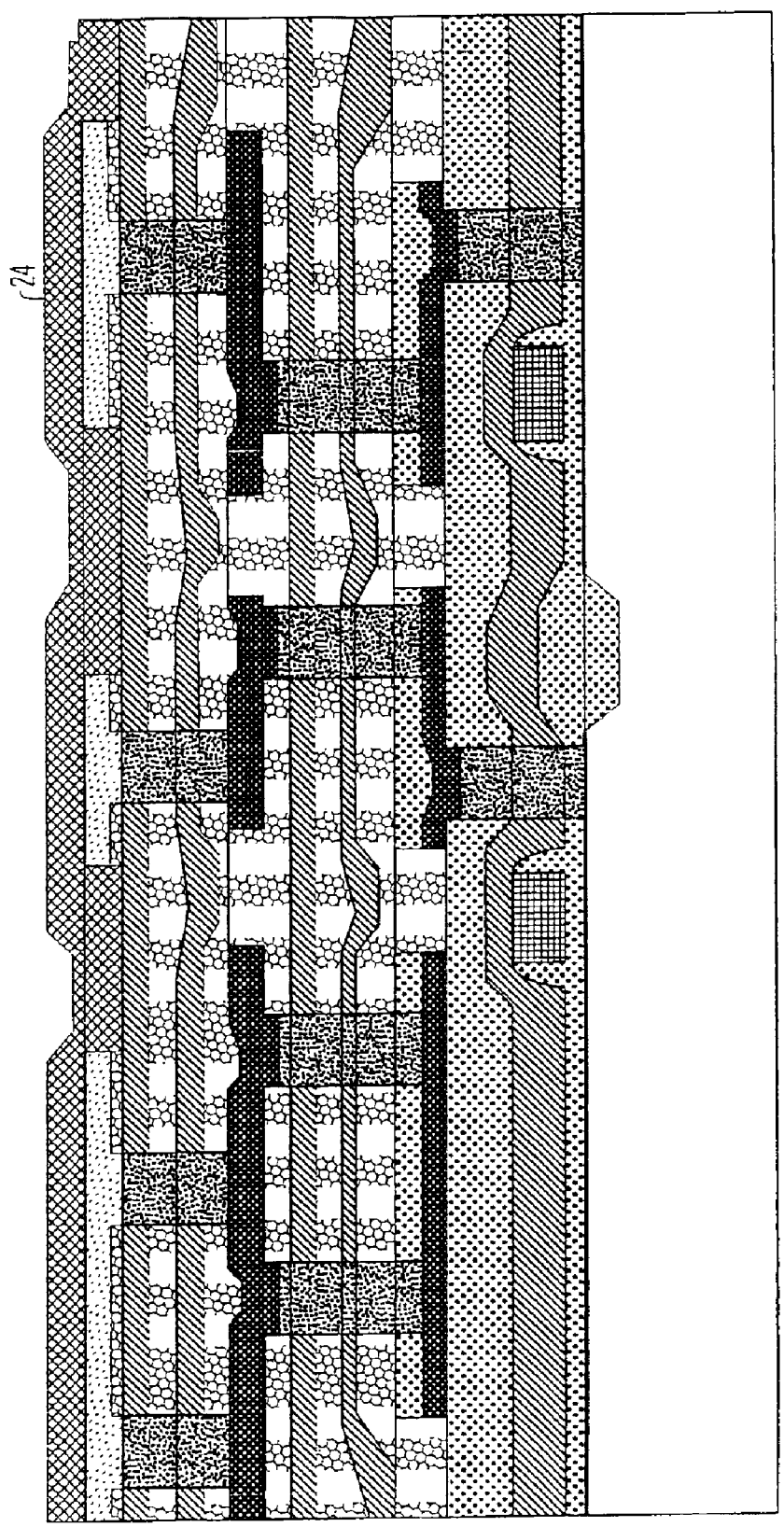
Figure 5:
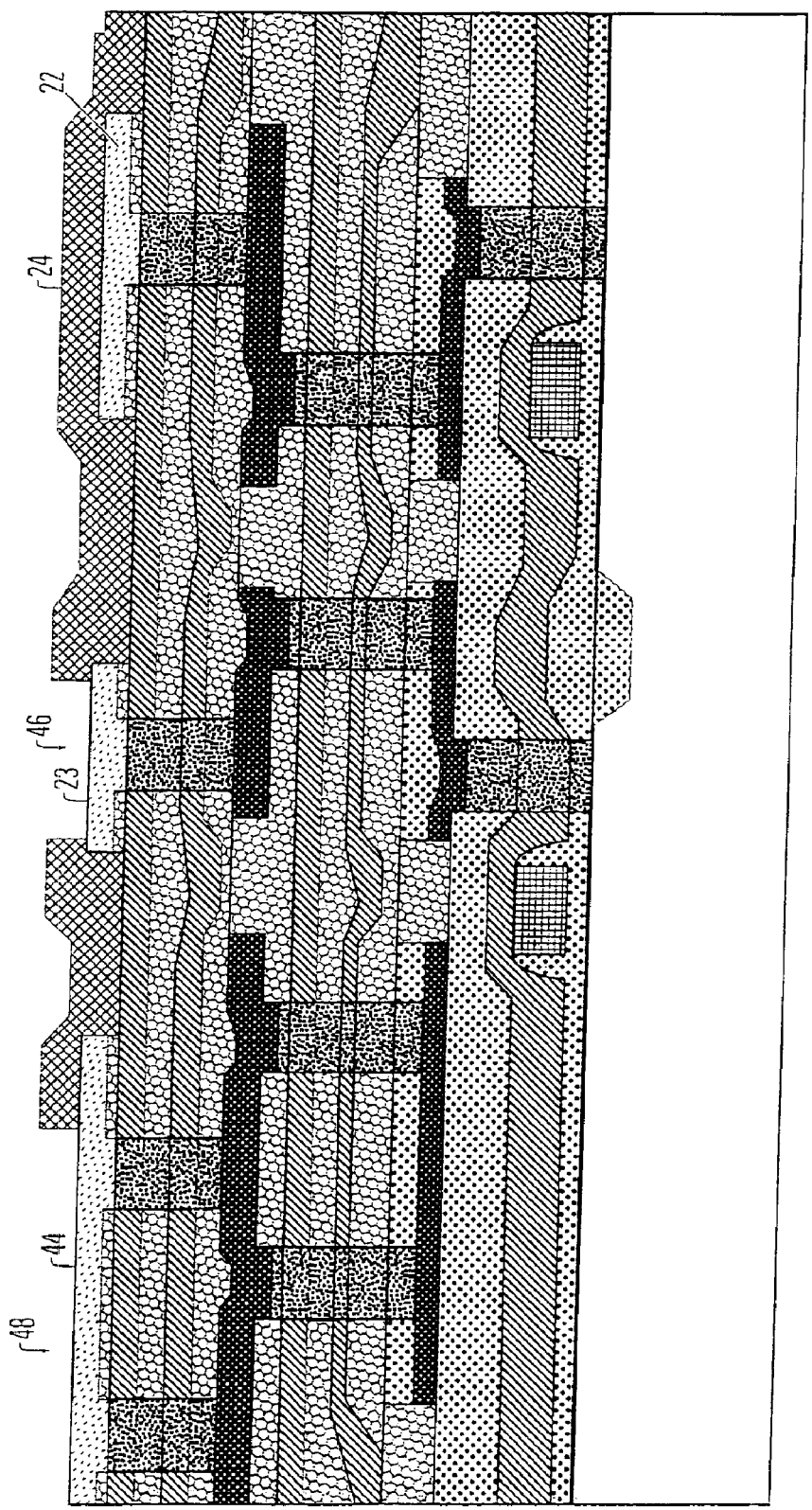
Figure 6:
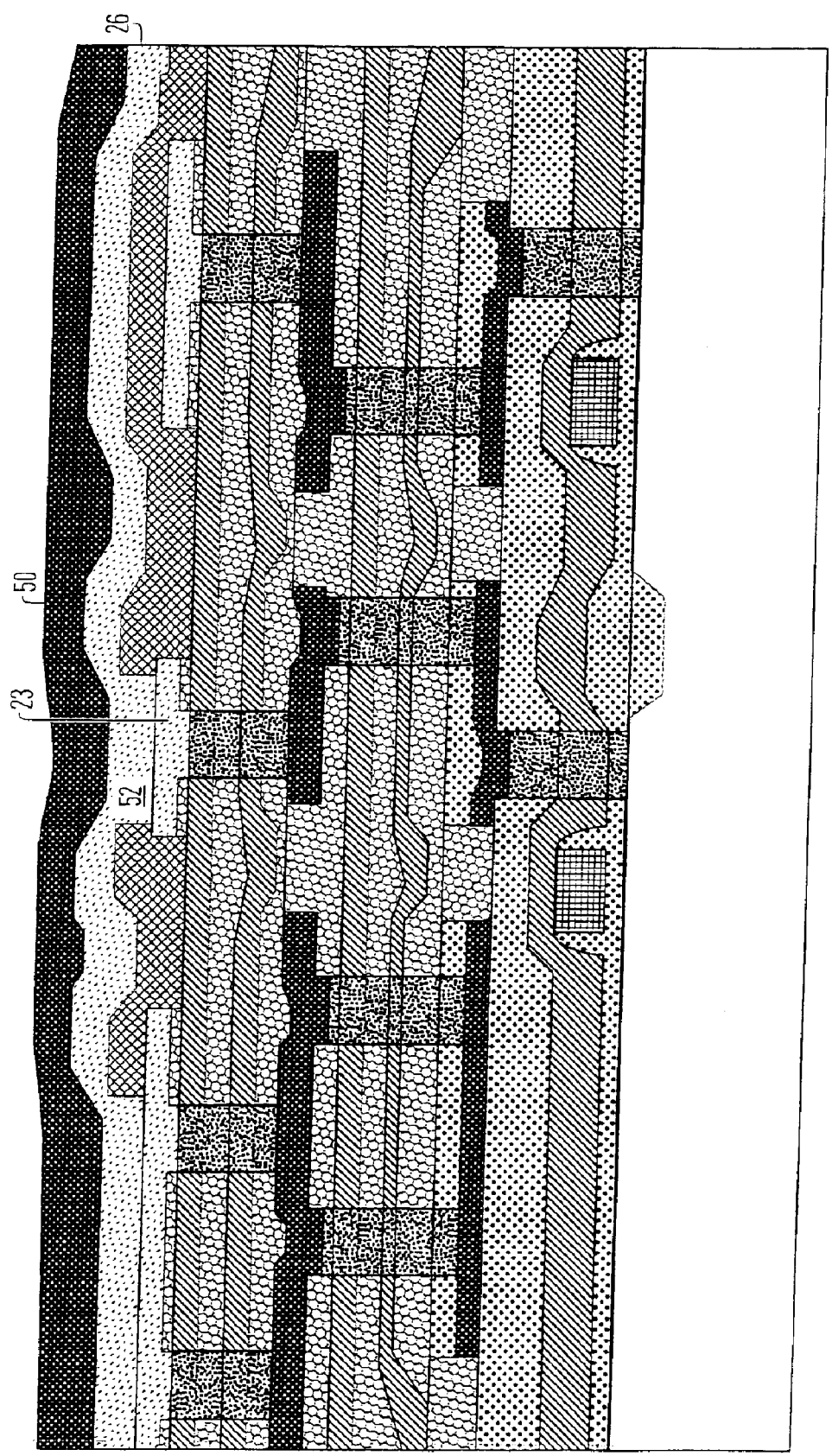
Figure 7:
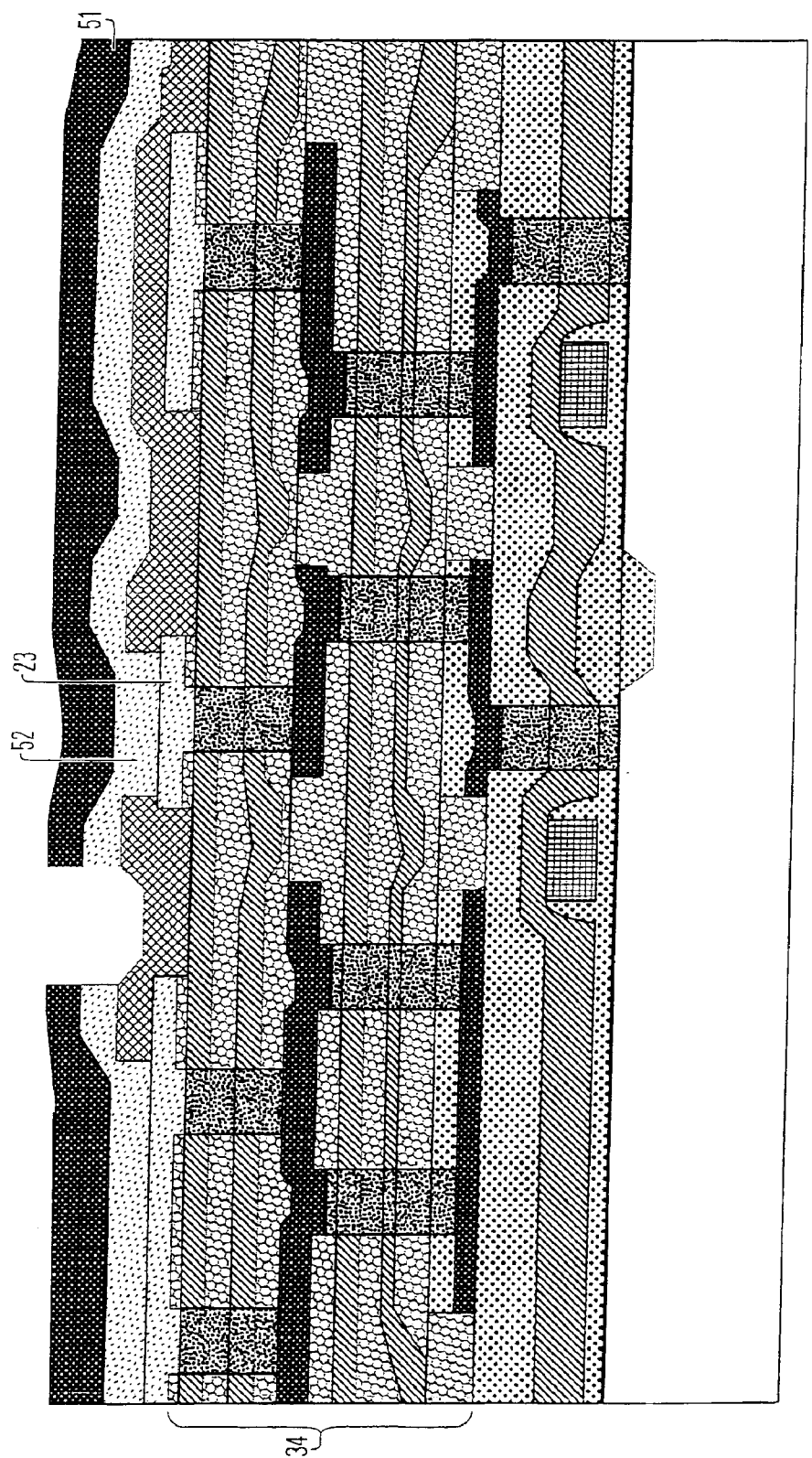
Figure 8:
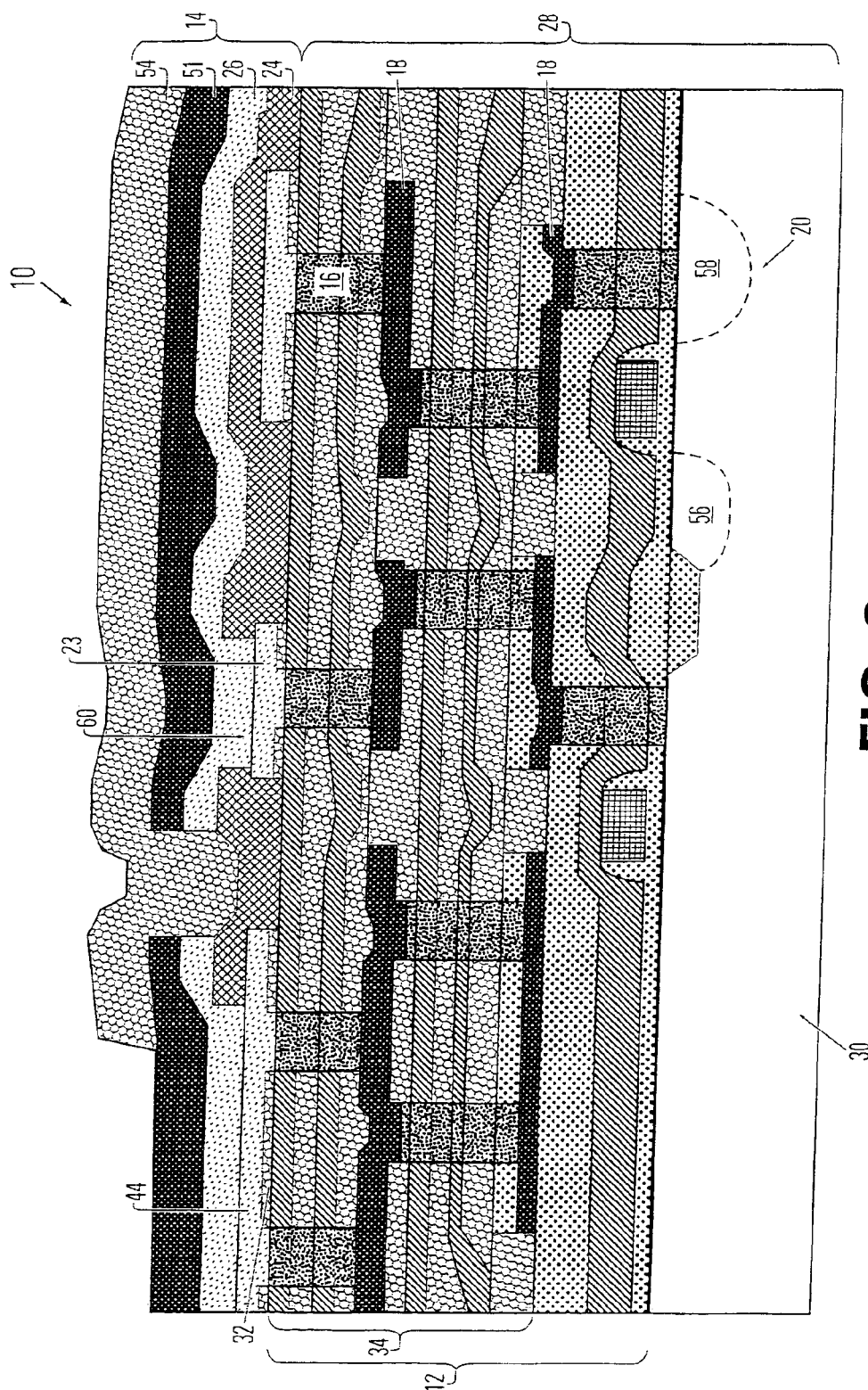
Figure 9:
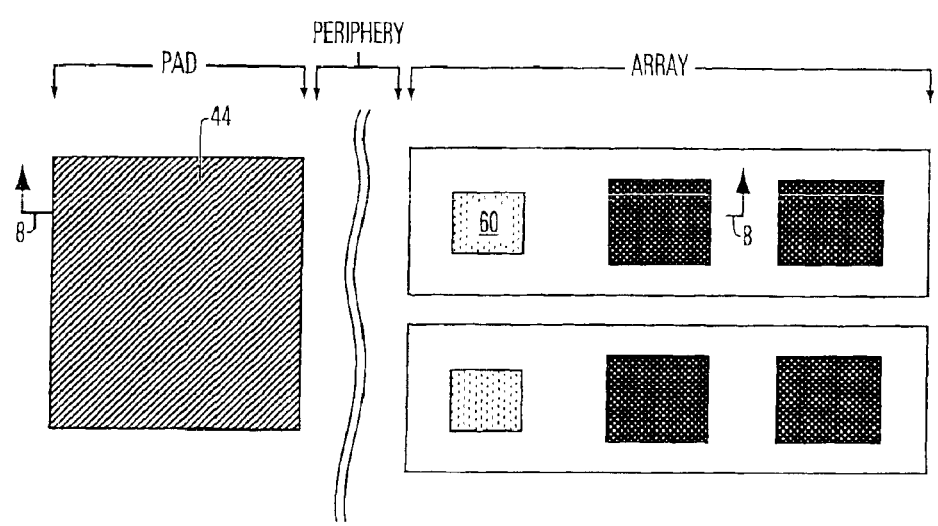
FIG. 9 is a simplified top view of the ferroelectric capacitor memory device of FIG. 8.

FIG. 4 illustrates the results of the deposition of second layer 24 made of ferroelectric material, PZT in this example, at about 400° C. It has been found that when first capacitor electrode 22 and second layer 24 are made of LNO and PZT, respectively, PZT grows epitaxially from the underlying LNO of first capacitor electrode 22 at a deposition temperature of about 350° C.–400° C. FIG. 5 illustrates the results of patterning second layer 24 to form contact openings 46 above contacts 23 and pad openings 48 above pads 44. Second layer 24 acts as a ferroelectric dielectric layer. FIG. 6 illustrates the results of depositing second capacitor electrode 26 to create a via 52 within contact opening 46. Via 52 extends to contact 23. This is followed by depositing a conductive layer 50 onto second capacitor electrode 26. FIG. 7 illustrates the 7 results of patterning conductive layer 50 at appropriate positions through conductive layer 50, patterned conductive layer 50 now called plate line 51. Via 52 connects contact 23 to plate line 51. Finally, FIG. 8 illustrates the finished ferroelectric capacitor memory device 10 with the deposition of a passivation layer 54, typically made of SiO2/Al2O3 or SiN/SiO2/Al2O3, and the creation of plate line contact 60 at via 52 connecting plate line 51 and contact 23. Pass transistor 20 comprises source 56 and drain 58 coupled to interconnect lines 18 (the interconnect lines comprising word lines and bit lines) and contact plugs 16. FIG. 9 illustrates, in simple form, where the cross-sectional view of FIG. 8 is taken.

Modifications and variations can be made to be disclosed embodiments without departing from the subject of the invention as defined in the following claims. For example, appropriate materials other than LaNiO$_3$ (LNO) may be used for one or both of the first and second capacitor electrodes 22, 26, appropriate materials other than lead zirconate titanate (PZT), lead lanthanum zirconate titanate (PLZT), and SrBi$_2$TaO$_9$ (SBT) may be used for second layer 24, and appropriate materials other than platinum/titanium may be used for barrier layer 32. While it is preferred that the ferroelectric subassembly 14 be formed at temperatures of less than about 400° C., higher temperatures may be found suitable for part or all of the deposition procedures for ferroelectric subassembly 14.

Any and all patents, patent applications and printed publications referred to above are incorporated by reference.

What is claimed is:

1. A ferroelectric subassembly, for an integrated circuit, comprising:
   first, second and third layers, said second layer being between the first and third layers and in contact therewith;
   the first layer comprising a single layer of material having a first side and having a second side in contact with the second layer;
   said second layer comprising a ferroelectric material;
   said first and third layers comprising capacitor electrodes in contact with the second layer; and
   at least a portion of the second side of the first layer contacting the second layer having the same crystal structure as said second layer, whereby said first layer acts as both a seed layer for said ferroelectric material and as a capacitor electrode.

2. The subassembly according to claim 1 wherein the first layer comprises LaNiO3 (LNO) in contact with the second layer.

3. The subassembly according to claim 1 wherein the first and third layers comprise LaNiO3 (LNO) in contact with the second layer.

4. The subassembly according to claim 1 wherein the first, second and third layers comprise epitaxial layers.

5. The subassembly according to claim 1 wherein the layers each comprise perovskite phase material.

6. The subassembly according to claim 1 wherein the second layer comprises lead zirconate titanate (PZT).

7. The subassembly according to claim 1 wherein the second layer comprises lead lanthanum zirconate titanate (PLZT).

8. The subassembly according to claim 1 wherein the second layer comprises SrBi$_2$TaO$_9$ (SBT).

9. The subassembly according to claim 1 wherein any lattice mismatch between the first and second layers is less than about 5 percent.

10. The subassembly according to claim 1 wherein at least the portion of the third layer contacting the second layer has the same crystal structure as the second layer.

11. The subassembly according to claim 10 wherein any lattice mismatch between the first and second layers and between the second and third layers is less than about 5 percent.

12. A ferroelectric capacitor memory device comprising:
   an integrated circuit (IC) layer comprising a pass transistor; and
   a ferroelectric subassembly, formed on the IC layer and operably coupled to the pass transistor, comprising:
      first, second and third layers, said second layer being between the first and third layers and in contact therewith;
      the first layer comprising a single layer of material having a first side in contact with the IC layer and a second side in contact with the second layer;
      said second layer comprising a ferroelectric material in contact with the third layer;
      said first and third layers comprising capacitor electrodes; and
      at least a portion of the first layer contacting the second layer having the same crystal structure as said second layer, whereby said first layer acts as both a seed layer for said ferroelectric material and as a capacitor electrode.

13. The device according to claim 12 further comprising bit, word and plate lines coupled to the pass transistor.

14. The device according to claim 12 wherein at least the portion of the third layer contacting the second layer has the same crystal structure as the second layer.

15. The device according to claim 12 wherein the first layer comprises LaNiO$_3$ (LNO) in contact with the second layer.

16. The device according to claim 12 wherein the first and third layers comprise LaNiO$_3$ (LNO) in contact with the second layer.

17. The device according to claim 12 wherein the IC layer is a complementary metal oxide semiconductor integrated circuit layer.

18. The device according to claim 12 wherein the IC layer comprises an interconnect layer with metal interconnects to which the ferroelectric subassembly is connected.

19. The device according to claim 12 wherein the first layer comprises LaNiO$_3$ (LNO) and the IC layer comprises a barrier layer, the LNO contacting the barrier layer.

20. The device according to claim 19 wherein the barrier layer comprises platinum.

* * * * *